United States Patent

[11] 3,596,347

[72] Inventors Julian Robert Anthony Beale;
John Martin Shannon, both of Surrey, England
[21] Appl. No. 753,449
[22] Filed Aug. 19, 1968
[45] Patented Aug. 3, 1971
[73] Assignee U.S. Philips Corporation
New York, N.Y.
[32] Priority Aug. 18, 1967
[33] Great Britain
[31] 38144/67

[54] METHOD OF MAKING INSULATED GATE FIELD EFFECT TRANSISTORS USING ION IMPLANTATION
10 Claims, 15 Drawing Figs.

[52] U.S. Cl. 29/571, 29/578, 148/187
[51] Int. Cl. B01j 17/00, H01g 13/00
[50] Field of Search 29/571, 578, 576 T, 576 B

[56] References Cited
UNITED STATES PATENTS

| | | | |
|---|---|---|---|
| 3,328,210 | 6/1967 | McCaldin et al. | 29/576 (T) |
| 3,445,926 | 5/1969 | Medved et al. | 29/578 |
| 3,481,031 | 12/1969 | Klasens | 29/571 |

*Primary Examiner*—John F. Campbell
*Assistant Examiner*—W. Tupman
*Attorney*—Frank R. Trifari

ABSTRACT: A method of making an insulated gate field transistor is described. Source and drain contact regions are first formed in a semiconductor, after which a metal ion mask is provided over the body to form metal contacts to the source and drain regions and a metal gate. Following this, ions are implanted in the semiconductor through an insulating layer covering the semiconductor so as to extend the source and drain regions to the edge of the metal gate which serves as a mask to define the desired channel length. Preferably the metal layer which provides the source and drain contacts and the gate is grounded to the ion-generating equipment to prevent charging of the insulating layer.

Figure 1:
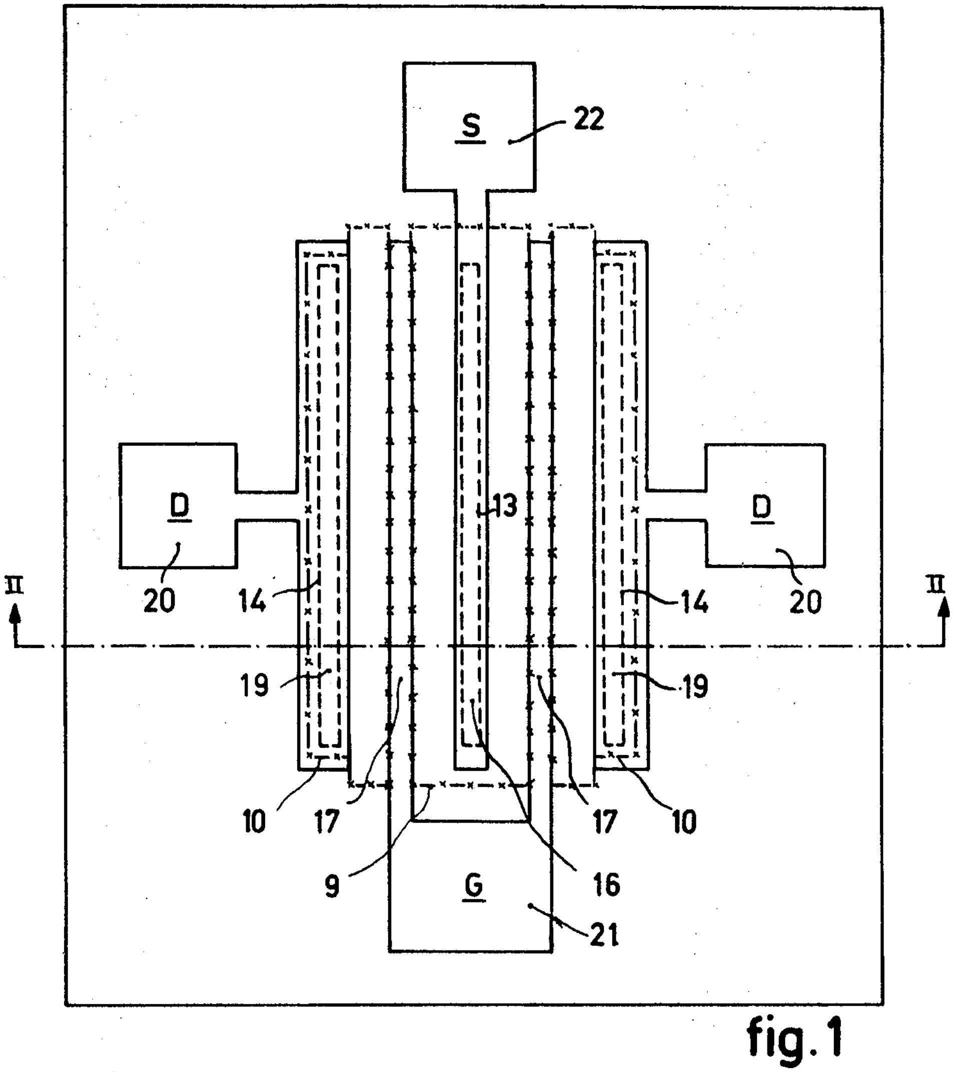

INVENTORS
JOHN M. SHANNON
BY JULIAN R.A. BEALE

AGENT

INVENTORS
JOHN M. SHANNON
BY JULIAN R.A. BEALE
Frank R. Trifari
AGENT

INVENTORS
JOHN M. SHANNON
JULIAN R.A. BEALE
BY
AGENT

INVENTORS
JOHN M. SHANNON
BY JULIAN R.A. BEALE
Frank R. [signature]
AGENT

INVENTORS
JOHN M. SHANNON
BY JULIAN R.A. BEALE

AGENT

INVENTORS
JOHN M. SHANNON
BY JULIAN R.A. BEALE
[signature]
AGENT

METHOD OF MAKING INSULATED GATE FIELD EFFECT TRANSISTORS USING ION IMPLANTATION

The invention relates to a method of manufacturing a semiconductor device comprising an insulated gate field effect transistor and to a semiconductor device manufactured by such a method. The insulated gate field effect transistor may form part of a semiconductor integrated circuit.

An insulated gate field effect transistor is to be understood to mean herein a semiconductor body or body part of one conductivity type, two spaced, low resistivity regions of the opposite conductivity type extending in the body or body part from one surface thereof and defining in the body or body part between the low resistivity regions a current carrying channel region adjacent the one surface, a gate electrode situated on the one surface between the low resistivity regions and separated from the one surface by an insulating layer, and ohmic contacts on the one surface to the low resistivity regions. The two low resistivity regions are referred to as the source and drain regions.

One commonly known form of such a transistor is the Metal-Oxide-Semiconductor-Transistor, generally referred to as the MOST. In this device generally the semiconductor body is of silicon and the gate electrode is spaced from the silicon surface by an insulating layer of silicon oxide. In operation the applied voltage between the source and drain regions is such that the P-N junction between the source and the adjacent substrate part of the semiconductor body is usually, but not always unbiased and the P-N junction between the drain and the substrate is reverse biased. Current flow between the source and drain regions is controlled in accordance with the voltage applied between the source region and the gate electrode. In the so-called enhancement mode, on application of a voltage of suitable polarity to the gate electrode a current flow is initiated between the source and drain. In one configuration of the transistor suitable for use in the enhancement mode the voltage applied to the gate causes a surface inversion layer to be formed in the semiconductor body below the insulating layer in the current-carrying channel region between the source and drain regions. MOST's may also be prepared which operate in the so-called depletion mode. In these devices current flow between the source and drain occurs with no applied voltage on the gate electrode. The concentration of charge carriers in the current carrying channel region is decreased by the application of a voltage of suitable polarity to the gate electrode. Such a device may also be operated in the enhancement mode by increasing the concentration of charge carriers in the current carrying channel region by the application of a voltage of suitable polarity to the gate electrode.

Hitherto the manufacture of a MOST has involved the formation of the low resistivity source and drain regions by diffusion techniques. For example, in the manufacture of a P-channel silicon MOST having an N-type silicon substrate, the $P^+$-type source and drain regions are formed by diffusion of an acceptor element, for example, boron, into limited surface portions of the silicon surface exposed by openings formed in a silicon oxide layer on the surface. The silicon oxide layer may then be removed and a fresh silicon oxide layer provided on the surface. Openings are formed in the fresh silicon oxide layer to expose the source and drain regions. A metal layer, for example of aluminum, is deposited in these openings and on the remainder of the surface of the silicon oxide layer. Thereafter the metal layer is selectively removed by photolithographic techniques to leave metal contact layers to the source and drain regions and a gate electrode metal layer on the silicon oxide layer.

In order to achieve an operative device, generally it is necessary that the length of the gate electrode in the direction between the source and drain regions is such that the gate electrode lies above the entire length of the current carrying channel region in said direction. In order to ensure that the gate electrode is of such a length the last-mentioned step of manufacture, in which the metal layer is selectively removed to leave the gate electrode metal layer, is invariably carried out such that the gate electrode slightly overlaps the source and drain regions. In operation of the device this overlap of the gate electrode gives rise to an undesired capacitance between the gate and drain. This capacitance is found to be a limiting factor on the operational frequency of the device since in operation this capacitance causes feedback.

In semiconductor technology the process of ion implantation has been employed in the manufacture of silicon devices. Ion implantation involves the bombardment of semiconductor material with beams of energetic dopant ions to form regions of different conductivity and/or conductivity type. This invention provides a method of manufacturing an insulated gate field effect transistor in which the gate to drain capacitance is low, by using the process of ion implantation in such a way, that in a minimum of operation steps and with a maximum of reproducibility an insulated gate field effect transistor is obtained in which the length of the current carrying channel region between the source and drain regions is accurately controlled and may be made comparatively small in order to yield a transistor having a high mutual conductance.

According to the invention a method of manufacturing an insulated gate field effect transistor, as described in the preamble is characterized in that said ions of a conductivity type determining impurity element characteristic of the opposite conductivity type are implanted through the insulating parts on the one surface not masked by the source, drain and gate electrode metal layer parts and into the portions of the semiconductor body or body part underlying said insulating layer parts to extend the two low resistivity regions towards each other and form spaced, low resistivity source and drain regions of the opposite conductivity type which define at the surface adjacent region therebetween a current carrying channel region, the length of the current carrying channel region in the direction between the source and drain regions so formed corresponding substantially to the length of the gate electrode metal layer part in said direction.

In this method an insulated gate field effect transistor is formed in which substantially no overlap of the gate electrode metal layer with the source and drain region occurs so that, in particular, the capacitance between the gate and drain is very low, for example this capacitance may be reduced to one-twentieth of the value obtained for a device formed by the conventional diffusion techniques. This permits devices to be obtained in which the frequency of operation may be high. As this method yields a transistor in which the length of the current carrying channel region corresponds substantially to the length of the gate electrode metal layer part, the said length of the channel may be controlled accurately and may be made comparatively smaller than is normally readily possible in a method employing diffusion techniques alone. Furthermore by the implantation of ions into the said portions of the semiconductor body or body part through said unmasked insulating layer parts on the one surface, a relatively simple method is provided since the insulating layer parts through which the implantation of ions occurs may form part of the same insulating layer as that on which the gate electrode metal layer part is present and hence after the implantation no further processing steps to remove any parts of this insulating layer will be necessary because the source and drain electrode metal layers are already provided, extending in openings therein. This method in which implantation is effected through said unmasked insulating layer parts has many advantages in comparison to a method in which implantation is effected in the presence of a gate electrode metal layer but with no insulating layer parts present on the surface portion into which implantation is effected. To perform the latter method it would be necessary, in addition to defining the gate electrode metal layer before implantation, to define openings in an underlying insulating layer on the one surface. This in many cases would be unsatisfactory because the definition of openings in the insulating layer by etching may yield an underetching of this layer at positions below the periphery of the overlying gate electrode metal layer. If such underetching takes place, the subsequent implantation would not yield the desired channel length because the overhanging peripheral portion of the gate electrode metal layer masks the implantation of ions into the surface and the resultant structure has a channel length which is not entirely covered by the remaining insulating layer part associated with said gate electrode metal layers. Also in the method in which implantation is effected directly into the surface portions the resultant structure has source and drain regions which have unpassivated surface portions. Invariably a further processing stage would be required to provide a surface passivating layer whereas in the method according to the invention the passivation is at least partly provided by the insulating layer parts through which the implantation is effected.

In one preferred form of the method the initially provided two spaced, low resistivity regions of the opposite conductivity type are formed by diffusion of an element characteristic of the opposite conductivity type into two portions of the one surface exposed by openings in an insulating layer present on the one surface. This diffusion step thus forms two low resistivity regions of the opposite conductivity type with surface portions of which the subsequently provided electrode metal layer parts form ohmic contact prior to extending these regions by the subsequent ion implantation treatment to form the completed source and drain regions.

Subsequent to forming the two spaced low resistivity regions by diffusion, the insulating layer may be removed and a fresh insulating layer provided on the one surface prior to providing the source and drain electrode metal layer parts and the gate electrode metal layer part.

In another preferred form of the method the initially provided two spaced, low resistivity regions of the opposite conductivity type are formed by implantation of ions of an element characteristic of the opposite conductivity type into two limited surface portions of the one surface. Thus in this method the source and drain regions are formed entirely by ion implantation techniques and no diffusion steps are involved. This enables a device of precisely controlled dimensions, particularly for the source, drain and channel areas, to be manufactured. Also it permits devices having a very small current carrying channel length to be manufactured.

The impurity determining the conductivity type of the initially provided spaced, low resistivity regions of the opposite conductivity type, and the impurity determining the conductivity type of the ion implanted portions immediately adjacent the current carrying channel may be constituted by the same element.

The said initial implantation of ions into limited surface portions of the one surface may be effected through openings in a metal masking layer situated on an insulating layer present on the one surface.

The initial implantation of ions into the limited surface portions of the one surface may be a higher energy than the subsequent implantation of ions which is effected to extend the low resistivity regions towards each other.

During the implantation of ions through the insulating layer parts on the one surface not masked by the source, drain and gate electrode metal layer parts, these metal parts layer may together constitute a single metal layer which subsequent to said ion implantation is selectively removed to leave separate source and drain electrode metal layers and a gate electrode metal layer. The single metal layer may be connected to an earthing or ground point on the ion accelerator during the implantation in order to prevent charging of isolated parts of the semiconductor body and possible breakdown.

The semiconductor body or body part may be of silicon and the insulating layer between the gate electrode metal layer part and the one surface of the semiconductor body or body part may comprise silicon oxide. Such an insulating layer may additionally comprise a stabilizing layer on the silicon oxide and situated below the gate electrode metal layer part, for example a phosphorus glass stabilizing layer. The insulating layer may be of other materials, for example of silicon nitride or of a two part layer of silicon oxide and silicon nitride, the oxide layer part being situated on the semiconductor surface and the nitride layer part situated on the oxide layer part below the gate electrode metal layer part.

The source, drain and gate electrode metal layer parts may consist of aluminum.

Figure 2:
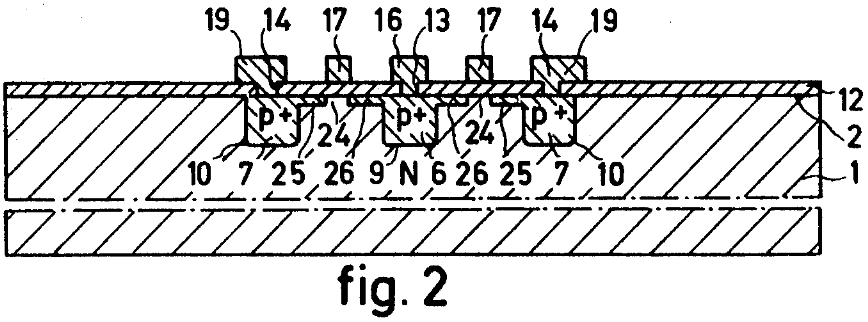

Two embodiments of the method according to the invention will now be described, by way of example, with reference to the accompanying diagrammatic drawings in which:

FIGS. 1 and 2 show in plan view and section respectively the semiconductor body of a silicon insulated gate field effect transistor manufactured by a first embodiment of the method;

FIGS. 3 and 4, FIGS. 5 and 6, FIGS. 7 and 8 show in plan view and section respectively the semiconductor body during various sequential stages of the manufacture of the field effect transistor shown in FIGS. 1 and 2; and FIGS. 9 to 15 show in section a semiconductor body during various sequential stages in the manufacture of in insulated gate field effect transistor by a second embodiment of the method.

The insulated gate field effect transistor shown in FIGS. 1 and 2 comprises an N-type silicon substrate 1 of 300 microns × 300 microns thickness and of 1—5 ohm.cm. resistivity. On a plane surface 2 of the body 1 there is an insulating layer 12 of silicon oxide of 2,000 A. thickness. In the substrate 1 there is a source regions consisting of $P^+$-type diffused region part 6 of rectangular surface area and peripheral $P^+$-type region parts 26 formed by implantation of boron ions. Two drain regions extend on opposite sides of the source region 6,26 and each consists of a $P^+$-type diffused region part 7 of rectangular surface area and an adjoining $P^+$-type region part 25 formed by implantation of boron ions and also of rectangular surface area. The $P^+$-N junctions 9 between the source region 6,26 and the N-stype substrate 1 and the $P^+$-N junctions 10 between the drain regions and the N-type substrate all terminate at the surface 2 below the silicon oxide layer 12. In the N-type substrate 1 between the source region 6,26 and the drain regions 7,25 there are two current carrying channel regions 24.

In an opening 13 in the insulating layer 12 where the diffused $P^+$-type part 6 of the source region 6,26 extends to the surface 2 there is a source electrode metal layer 16 forming ohmic contact with the source region 6,26. The metal layer 16 which is of aluminum further extends over the insulating layer 12 and at one end terminates in a large area bonding pad 22. In two further openings 14 in the insulating layer 12 where the diffused $P^+$-type parts 7 of the drain regions 7,25 extend to the surface 2 there are drain electrode metal layers 19 forming ohmic contact with the drain regions 7,25. The metal layers 19 which are of aluminum further extend over the insulating layer 12 and terminate in two large area bonding pads 20. Situated on the insulating layer 12 immediately above the current carrying channel regions 24 there are two rectangular gate electrode metal layers 17. The metal layers 17 which are of aluminum further extend over the insulating layer 12 and terminate in a single large area bonding pad 21.

In FIG. 1 the termination of the junctions 9 and 10 at the surface 2 below the insulating layer 12 are shown in chain-dot lines. The openings 13 and 14 in the insulating layer 12 are shown in broken lines. The length of the current carrying channel regions 24 in the direction between the source region 6,26 and the drain regions 7,25 corresponds substantially to the dimension of the gate electrode metal layers 17 in this direction. This dimension in each case is approximately 8 microns. The $P^+$-type diffused region parts 6 and 7 of the source and drain regions respectively have a sheet resistivity of less than 50 ohms per square and the $P^+$-type ion implanted region part 26 and 25 of the source and drain regions respectively have a sheet resistivity of approximately 3K ohms per square. The parts of the $P^+$-N junctions 9 and 10 between the $P^+$-type diffused region parts 6,7 and the N-type substrate 1 extending substantially parallel to the surface 2 are situated at a depth of approximately 2 microns from the surface 2. The parts of the $P^+$-N junctions 9 and 10 between the $P^+$-type ion implanted region parts 26, 25 and the N-type substrate 1 extending substantially parallel to the surface 2 are situated at a depth of approximately 0.2 microns from the surface 2. The $P^+$-type source region 6,26 has an overall width of approximately 48 microns. The $P^+$ -type diffused region part 6 of the source region has a width of approximately 22 microns. The $P^+$-type drain regions 7,25 each have an overall width of approximately 32 microns. The $P^+$-type diffused region parts 7 of the drain regions each have a width of approximately 20 microns. The aluminum layers 16, 17 and 19 each have a thickness of approximately 1.0 micron.

The measured capacitance between each gate electrode metal layer 17 and the drain region is 15 mpF which is considerably less than the value which would be obtained in an insulated gate field effect, transistor of similar dimensions but manufactured by diffusion techniques alone. The measured mutual conductance of the transistor shown in FIGS. 1 and 2 is comparable to that obtained in such a transistor manufactured by diffusion techniques alone.

The manufacture of the insulated gate field effect transistor shown in FIGS. 1 and 2 will now be described with reference to FIGS. 3 to 8. The starting material is a slice of N-type silicon of approximately one inch diameter. It will be appreciated that the processing is carried out to form simultaneously a plurality of transistors on the slice which are separated at a late stage in the manufacture by dividing the slice. However, the manufacture of one such transistor on the slice will now be described, it being understood that the various steps involved are each carried out simultaneously at a plurality of locations on the slice.

Figure 3:
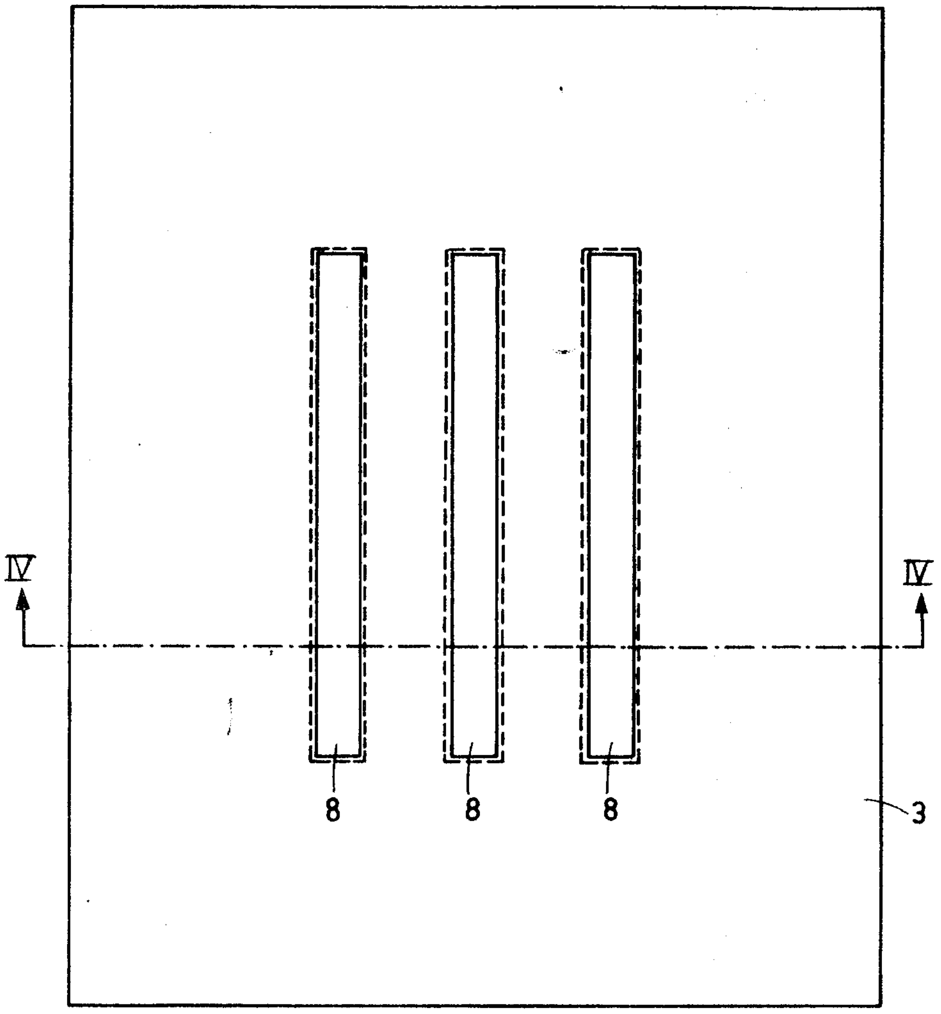
Figure 4:
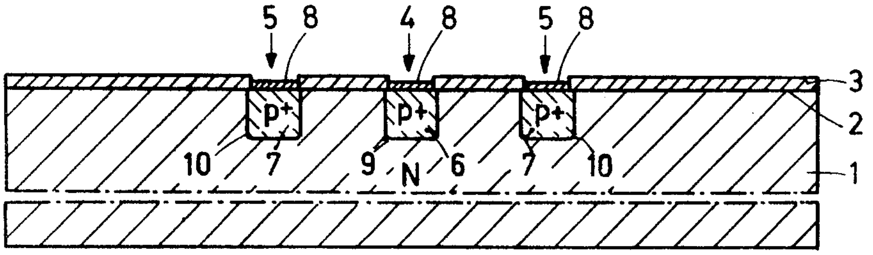

The orientation of the slice is 111. The surface 2 is suitably prepared to be optically flat by the normal techniques of etching and polishing. On the surface 2 there is grown a silicon oxide layer 3 of approximately 2,000 A. thickness by oxidation of the silicon surface 2 for 60 minutes at 1,000° C. in wet oxygen. By photolithographic techniques a central rectangular opening 4 of 20 microns × 190 microns and on opposite sides thereof two rectangular openings 5 of 18 microns × 190 microns are formed in the silicon oxide layer 3 to expose the underlying silicon surface. A boron diffusion step is then carried out to diffuse boron into the exposed surface portions and form a central $P^+$-type diffused region 6 and on opposite sides thereof two $P^+$-type diffused regions 7 with the $P^+$-N junctions 9 and 10 formed between the $P^+$-type regions 6,7 and the N-type substrate 1 terminating at the surface 2 below the silicon oxide layer 3. The boron diffusion is carried out using boron nitride as the source of boron. The silicon body is maintained at 900° C. and the boron nitride at 980° C. The gas flow is maintained during a deposition stage until the sheet resistivity of the areas on which the boron deposition occurs is less than 50 ohms per square. A drive-in stage is then carried out with the silicon body at 1,000° C. for 30 minutes in argon. FIG. 3 shows the termination of the junction 9 and 10 at the surface 2 in broken lines. During the boron diffusion process on the exposed parts of the surface 2 borosilicate glass layer parts 8 are formed. Also the layer 3 is increased in thickness to a slight extent by such a glass layer.

The composite insulating layer 3,8 is then removed and a fresh insulating layer of silicon oxide is then grown on the surface 2 by oxidation of the silicon surface 2 for 30 minutes at 1,000° C. in wet oxygen. This silicon oxide layer is then etched until a layer 12 having a thickness of 2,000 A. is obtained. By photolithographic techniques three openings are made in the silicon oxide layer 12. One such opening 13 exposes the $P^+$-type diffused region 6 where it extends at the surface 2 and the other two openings 14 expose the $P^+$-type diffused regions 7 where they extend at the surface 2. The openings 13 and 14 each have an area of 8 microns × 180 microns.

Figure 5:
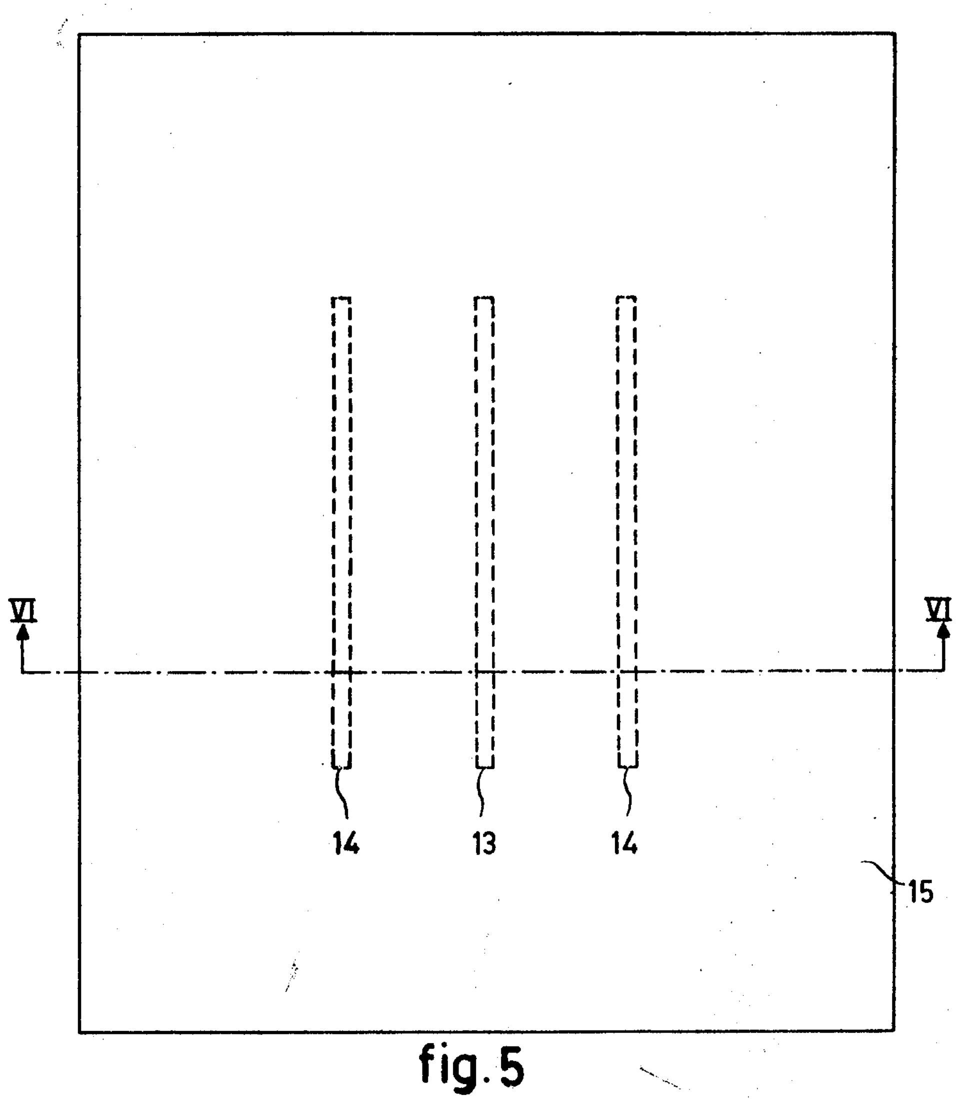
Figure 6:
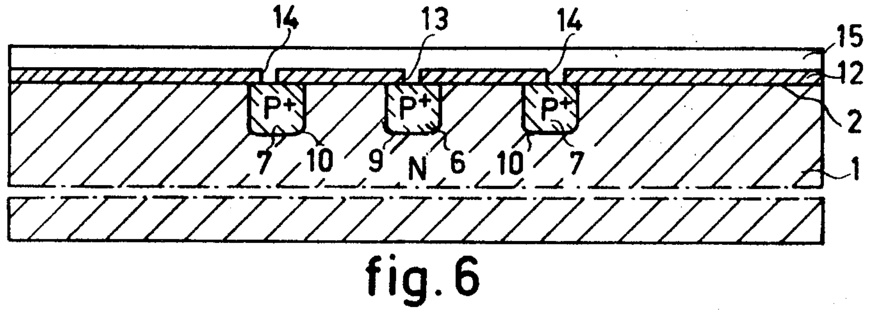

An aluminum layer 15 of 1.0 micron thickness is then deposited over the entire surface of the silicon oxide layer 12 and fills the openings 13 and 14 forming ohmic contact to the regions 6 and 7 (FIG. 6). FIG. 5 shows the location of the openings 13 and 14 in broken lines.

Figure 7:
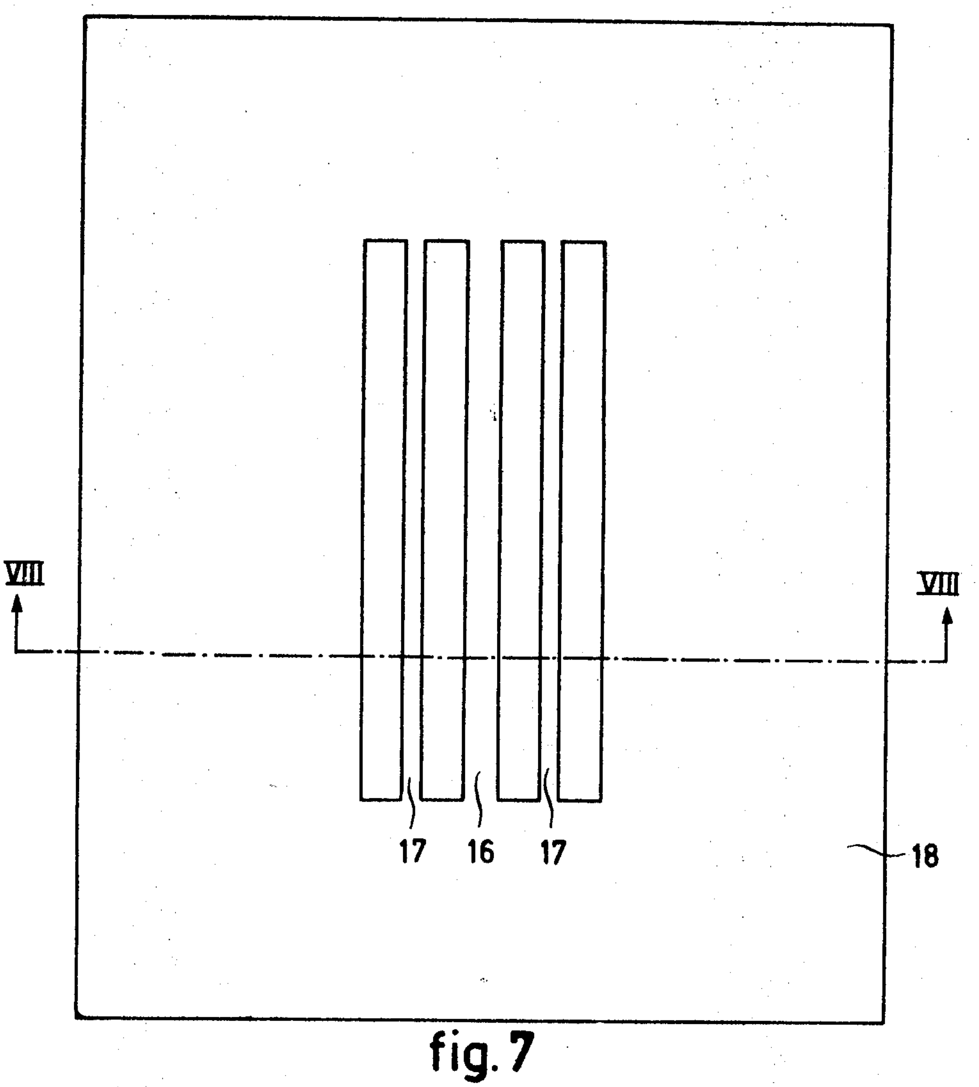
Figure 8:
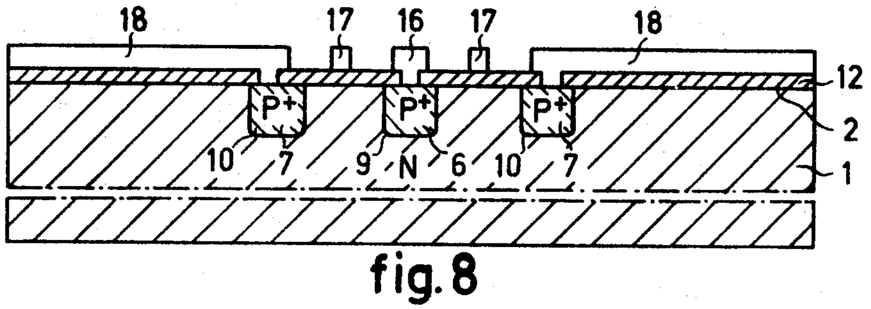
Figure 9:
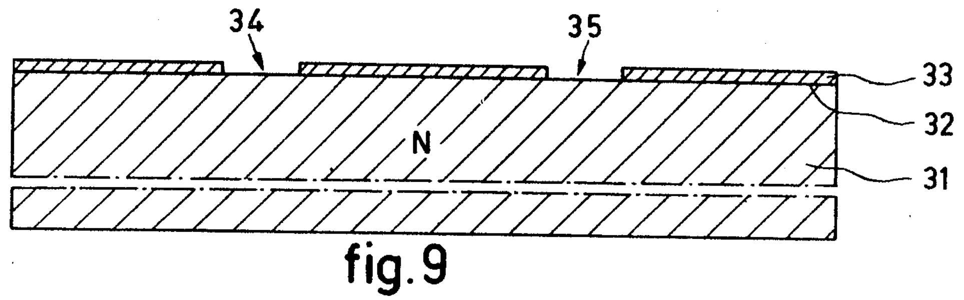
Figure 10:
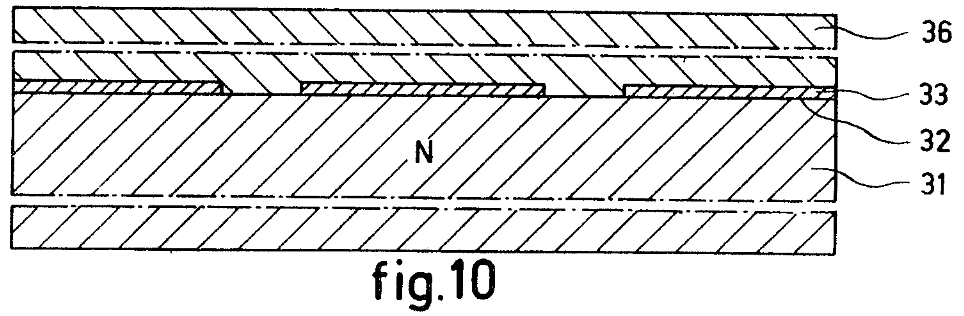
Figure 11:
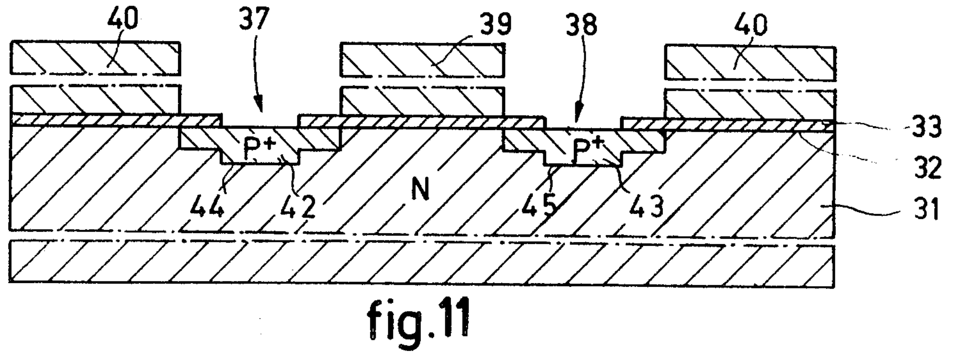

The aluminum layer 15 is then selectively removed by photolithographic techniques to leave, a source electrode metal layer part 16 forming ohmic contact with the $P^+$-type diffused region 6, two gate electrode metal layer parts 17 and drain electrode metal layer parts 18 forming ohmic contact with the $P^+$-type diffused regions 7. This is carried out by removing four substantially rectangular areas of the aluminum layer 15. The resultant metal layer parts 16, 17 and 18 at this stage of the processing are still connected together. These openings expose portions of the silicon oxide layer 12 situated on the surface 2 between the $P^+$-type regions 6 and 7, and above the outer periphery of the region 6 and the inner peripheries of the regions 7, the gate electrode metal layer part 17 lying within the area of the surface between the regions 6 and 7. FIG. 7 shows the metal layer parts 16, 17 and 18.

The silicon body is then placed in the target chamber of an ion implantation apparatus. The implantation of boron ions is effected through the silicon oxide layer 12 into the parts of the body below the portions of the silicon oxide layer 12 not covered by the aluminum layer parts 16, 17 and 18 which act as a mask. During the implantation the aluminum layer 16, 17, 18 is connected to an earthing point on the ion accelerator. The boron ion source consists of boron trichloride. The implantation energy is 80 KeV, the dose is $6 \times 10^{15}$ atoms/sq. cm. and the orientation of the body is with the plane of the surface 2 normal to the direction of the ion beam. Implantation of boron ions occurs through the exposed portions of the silicon oxide layer 12. After removal from the apparatus the silicon body is subjected to an annealing treatment at 500° C. for 30 minutes in an atmosphere of argon.

The implantation and annealing treatment results in the formation of $P^+$-type regions parts 26 and 25. The region parts 26 thus extend the previously formed $P^+$-type diffused region part 6 towards the previously formed regions 7 and to form a completed $P^+$-type source region 6,26. The region parts 25 extend the previously formed $P^+$-type diffused region parts 7 towards the previously formed region 6 and to form two completed $P^+$-type drain regions 7,25. However, due to the presence of the gate electrode metal layer parts 17 during the implantation, current carrying channel regions 24 remain substantially free of boron ions and the length of these regions in the direction between the source region 6,26 and the drain regions 7,25 corresponds substantially to the corresponding dimensions of the gate electrode metal layers 17.

The aluminum layer parts 18 are then selectively removed by a photolithographic process to leave an aluminum contact pattern as is shown in FIGS. 1 and 2, the source electrode metal layer 16 terminating in a large area bonding pad 22, the gate electrode metal layers 17 terminating in a large area bonding pad 21 and the drain electrode metal layers 19 each terminating in large area bonding pads 20.

The individual insulated gate field effect transistors are then obtained from the large area slice by the normal techniques of dicing. Thereafter each individual transistor is provided with a suitable encapsulation.

It will be appreciated that in the MOST manufactured by this method the dimensions and the geometry have not been chosen with a view to obtaining a device of high performance but have been chosen to demonstrate the feasibility of producing a MOST by the method according to the invention and having a low gate to drain capacitance. By suitable reduction of various dimensions a higher performance device can be manufactured by the method. For example, a device having higher gain is obtained by reducing the separation of the source and drain regions and the length of the gate electrode metal layer. By reducing the width of the ion implanted region parts a device having lower source and drain series resistance can be obtained.

A second embodiment of the method will now be described with reference to FIGS. 9 to 15 of the accompanying drawings. In this method the $P^+$-type source and drain regions of an N-type substrate, silicon MOST are formed entirely by ion implantation techniques, there being no diffusion steps involved. The starting material again is a large area slice 31 of N-type silicon of approximately 1 inch diameter. The resistivity of the silicon slice is approximately 1—5 ohm cm. Again the processing is carried out to form simultaneously a plurality of transistors on the slice which are separated at a late stage in the manufacture by dividing the slice. However, the manufacture of one such transistor will now be described, it will understood that the various steps involved are each carried out simultaneously at a plurality of locations on the slice.

The orientation of the slice is 111. The surface 32 is suitably prepared to be optically flat by the normal techniques of etching and polishing. On the surface 32 there is grown a silicon oxide layer by oxidation of the silicon surface 32 for 30 minutes at 1,000° C. in wet oxygen. This layer is then etched to yield a silicon oxide layer 33 of 2,000 A. thickness. By photolithographic techniques two openings 34 and 35 (FIG. 9) are formed in the silicon oxide layer 33 to expose the underlying silicon surface. The openings 34 and 35 each have a width of approximately 4 microns and their adjacent edges are separated by a distance of approximately 12 microns. An aluminum layer 36 (FIG. 10) is then deposited over the entire surface of the silicon oxide layer 33 and to fill the openings 34 and 35. The aluminum deposition is carried out to form a layer 36 of approximately 3 microns thickness. Two openings 37 and 38 (FIG. 11) are formed in the aluminum layer 36 by photolithographic techniques. These openings each are of 8 microns width and by this selective removal of the aluminum layer 36 the aluminum located in the previously formed openings 34 and 35 in the insulating layer 33 is removed. Thus in the openings 37 and 38 a peripheral part of the silicon surface is covered with the insulating layer 33 and a central part consists of the exposed silicon surface. Aluminum layer parts 39 and 40 remain which at this stage are still connected together. The width of the aluminum layer part 39 between the openings 37 and 38 is approximately 8 microns.

The silicon body is then placed in the target chamber of an ion implantation apparatus. The implantation of boron ions is effected into the parts of the body not covered by the aluminum layer parts 39 and 40 which act as a mask. During the implantation the aluminum layer parts 39 and 40 are connected to an earthing point on the ion accelerator. The boron ion source consists of boron trichloride. The implantation energy is 150 KeV, the dose is of the order of $10^{16}$ atoms/sq. cm. and the orientation of the body is with the surface 32 normal to the direction of the ion beam. Implantation of boron ions occurs into the N-type substrate 31 in these portions not covered by the masking layer parts 39 and 40. Thus boron ions are implanted into the exposed silicon surface parts and through the adjoining exposed parts of the silicon oxide layer 33.

The implantation treatment results in the formation of $P^+$-type regions 42 and 43 (FIG. 11) with the $P^+$-N junctions 44 and 45 between the region 42 and the substrate 31 and between the region 43 and the substrate 31 respectively, terminating at the surface 32 below the silicon oxide layer 33. The parts of the $P^+$-N junctions 44 and 45 situated below the exposed silicon surface are situated at a depth of approximately 0.75 microns from the surface 32 and the parts of the $P^+$-N junctions 44 and 45 situated below the silicon oxide layer parts are at a depth of approximately 0.55 microns from the surface 32.

The aluminum layer parts 39 and 40 are then removed and a fresh aluminum layer 47 of 1.0 micron thickness is deposited on the entire surface of the silicon oxide layer 33. The layer 47 fills the previously formed openings 34 and 35 in the silicon oxide layer 33 and forms ohmic contact with the $P^+$-type ion implanted regions 42 and 43.

Figure 12:
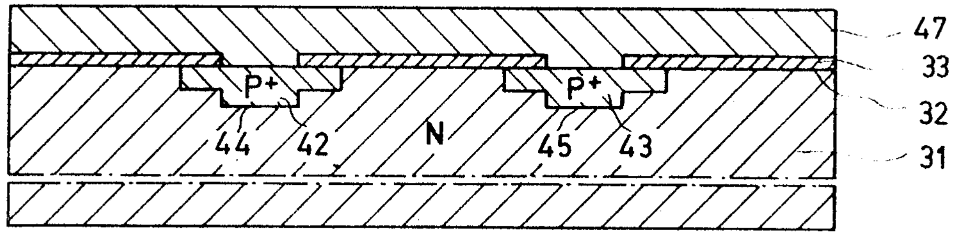

FIG. 12 shows the aluminum layer 47 on the silicon oxide layer 33 and forming ohmic contact with the regions 42 and 43.

Figure 13:
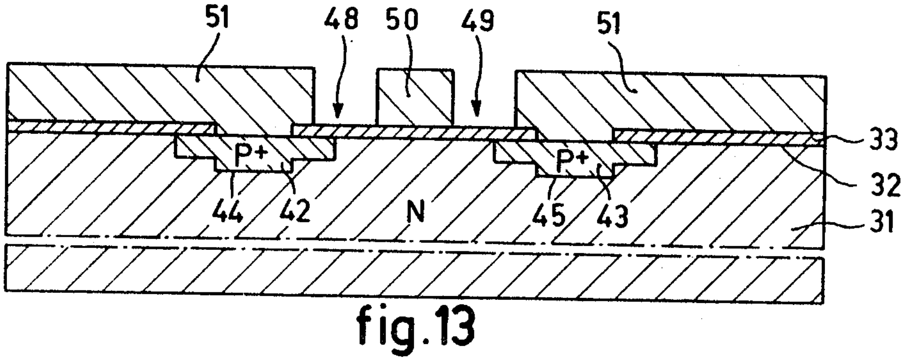

Two openings 48 and 49 are formed in the aluminum layer 47 by photolithographic techniques to expose the underlying silicon oxide layer 33. The openings 48 and 49 each have a width of 3 microns. This leaves aluminum layer parts 50 and 51 which at this stage are still connected together. FIG. 13 shows the aluminum layer parts 50 and 51 with the openings 48 and 49. The width of the aluminum layer part 50 is approximately 4 microns and this constitutes a gate electrode metal layer part.

The silicon body is then placed in a target chamber of an ion implantation apparatus for a further boron ion implantation step but at a lower energy than the previously carried out boron implantation step. The implantation of boron ions is effected through the silicon oxide layer 33 into the parts of the body below the portions of the silicon oxide layer 33 not covered by the aluminum layer parts 50 and 51 which act as a mask. During the implantation the aluminum layer parts 50 and 51 are connected to an earthing point on the ion accelerator. The implantation energy is 60 KeV, the dose of $6 \times 10^{15}$ atoms/sq. cm. and the orientation of the body is with the surface 32 normal to the direction of the ion beam. Implantation of boron ions occurs through the exposed portions of the silicon oxide layer 33. After removal from the apparatus, the silicon body is subjected to an annealing treatment at 500° C. for 30 minutes in an atmosphere of argon.

Figure 14:
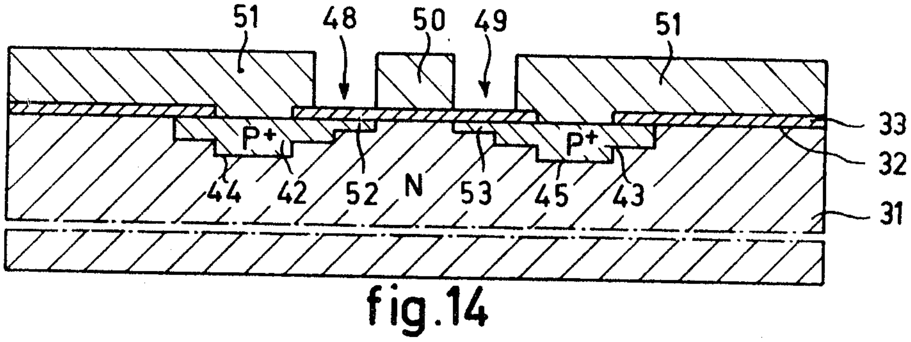

The implantation and annealing treatment results in the formation of $P^+$-type region parts 52 and 53 (FIG. 14). The region parts 52 and 53 thus extend the previously formed $P^+$-type regions 42 and 43 respectively, towards each other to form completed $P^+$-type source and drain regions (42,52) and (43,53) respectively. However, due to the presence of the gate electrode metal layer 50 during the implantation, a current carrying channel region 54 between the source region (42,52) and the drain region (43,53) remains substantially free of boron ions and the length of the region 54 in the direction between the source region (42,52) and the drain region (43,53) corresponds substantially to the corresponding dimension of the gate electrode metal layer part 50, that is, 4 microns.

Figure 15:
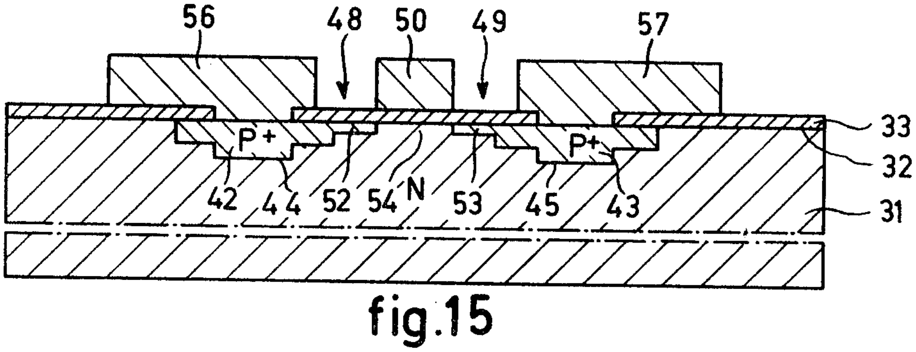

The aluminum layer part 51 is then selectively removed by a photolithographic process to leave separate source and drain metal layer electrodes 56 and 57 respectively as is shown in FIG. 15.

The individual insulated gate field effect transistors are then obtained by dicing of the large area slice and encapsuled.

It will be appreciated that many modifications of the methods described in the two embodiments can be made within the scope of the invention as defined in the appended claims. For example, if the metal layers are of nickel, higher annealing temperatures may be employed. A stabilizing layer, for example a phosphorus glass stabilizing layer, may be provided on the surface of the silicon oxide layer to reduce ion drift in the silicon oxide layer. This step may be combined with a so-called "wet baking" treatment of the composite insulating layer to reduce surface states at the silicon/silicon oxide interface. Also channelling can be employed in the ion implantation which gives a deeper penetration of the implanted ions. The maximum advantages of such a technique can be obtained by using material aligned to the 110 direction.

The method according to the first aspect of the invention may be suitably employed in the manufacture of an insulated gate field effect transistor forming part of a semiconductor integrated circuit, the transistor being formed in a semiconductor body part of the one conductivity type. The method of ion implantation may be used to form other circuit elements in further semiconductor body parts, for example bipolar transistors, diodes, resistors or other insulated gate field effect transistors having different properties.

What we claim is:

1. A method of making an insulated gate field effect transistor comprising forming in a semiconductor body portion of one conductivity type spaced source and drain surface regions of the opposite conductivity type, said source and drain regions being spaced apart at the surface by a distance greater than the desired channel length, providing an insulating layer on the surface at least at the portions overlying the source and drain regions and the spacing therebetween, providing on the insulating layer and at least over the channel region a layer of a metal capable of masking the underlying semiconductor against ion bombardment and through holes in the insulating layer, a layer of a metal forming contacts to the source and drain regions, said metal layer over the channel region to serve as the gate electrode and having the length desired of the channel region but leaving exposed on opposite sides surface areas of the insulator covered semiconductor extending from the source and drain regions, and then subjecting the said surface to ion bombardment using ions of a type that when implanted in a semiconductor of the one type will convert same to a semiconductor of the opposite type, the ion bombardment being carried out under conditions such that the ions will be blocked by the said metal layer mask but will pass through the unmasked insulating layer covered semiconductor surface to become implanted in the underlying semiconductor and convert same to the opposite type conductivity thereby to enlarge and extend the source and drain regions to the edge of the gate metal mask forming the desired length of the channel region.

2. A method of making an insulated gate field effect transistor as set forth in claim 1 wherein the initially provided wider spaced source and drain regions are formed by diffusion of opposite-type-conductivity-forming impurities through holes in an insulating layer previously formed on the semiconductor surface.

3. A method of making an insulated gate field effect transistor as set forth in claim 2 wherein the previously formed insulating layer is removed and replaced by a fresh insulating layer prior to provision of the masking metal layer.

4. A method of making an insulated gate field effect transistor as set forth in claim 1 wherein the initially provided wider spaced source and drain regions are formed by ion implantation of opposite-type-conductivity-forming ions into limited areas of the semiconductor surface.

5. A method of making an insulated gate field effect transistor as set forth in claim 4 wherein the ion implantation step forming the wider spaced source and drain regions is carried out through holes in a metal mask on an insulating layer on the surface.

6. A method of making an insulated gate field effect transistor as set forth in claim 5 wherein during the ion implantation steps, the metal mask is connected to the apparatus generating the ions to prevent charging of the insulating layer.

7. A method of making an insulated gate field effect transistor as set forth in claim 5 wherein the initial ion implantation step is at a higher energy than the later ion implantation step.

8. A method of making an insulated gate field effect transistor as set forth in claim 1 wherein the metal mask covering the channel region and the metal layer contacting the source and drain regions constitute a single metal layer on the insulating layer, said single metal layer being grounded to the ion-generating equipment during the ion-implantation step to prevent charging of the insulating layer.

9. A method of making an insulated gate field effect transistor as set forth in claim 8 wherein selected portions of the single metal layer are removed following the ion-implantation step leaving separate source and drain contacts and a separate gate electrode.

10. A method of making an insulated gate field effect transistor as set forth in claim 9 wherein the semiconductor is silicon, the insulating layer comprises silicon oxide, and the metal is aluminum.